(12) United States Patent
Kobayashi et al.

(10) Patent No.: US 10,396,714 B2
(45) Date of Patent: Aug. 27, 2019

(54) RECONFIGURABLE LOW-NOISE AMPLIFIER (LNA)

(71) Applicant: Qorvo US, Inc., Greensboro, NC (US)

(72) Inventors: Kevin Wesley Kobayashi, Redondo Beach, CA (US); Charles Forrest Campbell, Allen, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/660,554

(22) Filed: Jul. 26, 2017

(65) Prior Publication Data
US 2018/0091099 A1 Mar. 29, 2018

Related U.S. Application Data

(60) Provisional application No. 62/398,535, filed on Sep. 23, 2016.

(51) Int. Cl.
| | | |
|---|---|---|
| H03F 3/04 | (2006.01) | |
| H03F 1/02 | (2006.01) | |
| H03F 3/193 | (2006.01) | |
| H03F 1/56 | (2006.01) | |
| H03F 1/22 | (2006.01) | |

(Continued)

(52) U.S. Cl.
CPC ......... *H03F 1/0205* (2013.01); *H03F 1/0261* (2013.01); *H03F 1/223* (2013.01); *H03F 1/226* (2013.01); *H03F 1/56* (2013.01); *H03F 1/565* (2013.01); *H03F 3/193* (2013.01); *H03F 3/1935* (2013.01); *H03F 3/601* (2013.01); *H03F 3/72* (2013.01); *H03F 2200/111* (2013.01); *H03F 2200/18* (2013.01); *H03F 2200/294* (2013.01); *H03F 2200/387* (2013.01); *H03F 2200/451* (2013.01); *H03F 2203/7209* (2013.01)

(58) Field of Classification Search
CPC ........ H03F 1/226; H03F 1/565; H03F 3/1935; H03F 3/72
USPC .................... 330/311, 51, 302, 296
See application file for complete search history.

(56) References Cited

U.S. PATENT DOCUMENTS

| | | | | |
|---|---|---|---|---|
| 7,688,133 B2 * | 3/2010 | Yamamoto | ............ | H03F 1/0261 330/296 |
| 8,081,033 B2 * | 12/2011 | Kim | ........................ | H03F 1/223 330/278 |
| 8,149,050 B2 * | 4/2012 | Cabanillas | ............ | H03F 1/0277 330/302 |

OTHER PUBLICATIONS

El-Nozahi, Mohamed et al., "A CMOS Low-Noise Amplifier With Reconfigurable Input Matching Network," IEEE Transactions on Microwave Theory and Techniques, vol. 57, Issue 5, May 2009, IEEE, pp. 1054-1062.

(Continued)

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A reconfigurable low-noise amplifier (LNA) is disclosed. The reconfigurable LNA includes amplifier circuitry having a gate terminal coupled to an input terminal, a source terminal coupled to a fixed voltage node, and a drain terminal coupled to an output terminal. The reconfigurable LNA further includes a gamma inverting network (GIN) coupled between the input terminal and the fixed voltage node, wherein the GIN has a first switch configured to disable the GIN during operation at first frequencies within a lower frequency band relative to a higher frequency band and to enable the GIN during operation at second frequencies within the higher frequency band.

20 Claims, 16 Drawing Sheets

(51) Int. Cl.
H03F 3/60 (2006.01)
H03F 3/72 (2006.01)

(56) References Cited

OTHER PUBLICATIONS

Fu, Chang-Tsung et al., "A 2.4-5.4-GHz Wide Tuning-Range CMOS Reconfigurable Low-Noise Amplifier," IEEE Transactions on Microwave Theory and Techniques, vol. 56, Issue 12, Dec. 2008, IEEE, pp. 2754-2763.

Mattamana, A. et al., "Multi-octave and Frequency-agile LNAs Covering S-C Band using 0.25 μm GaN Technology," IEEE Compound Semiconductor Integrated Circuit Symposium (CSICS), Oct. 23-26, 2016, Austin, TX, USA, IEEE, 4 pages.

Shatzman, Jeffrey A., "An Electronically Reconfigurable Three Band Low-Noise Amplifier in 0.5 μm GaAs pHEMT Technology," Masters Theses 1896—Feb. 2014, Paper 642, May 2011, http://scholarworks.umass.edu/theses/642, Jeffrey A. Shatzman, 172 pages.

Yoo, Sang-Sun et al., "A Compact Reconfigurable LNA for Single Path Multistandard Receiver," IEEE Conference on Electron Devices and Solid-State Circuits, Dec. 20-22, 2007, Tainan, Taiwan, IEEE, pp. 461-464.

* cited by examiner

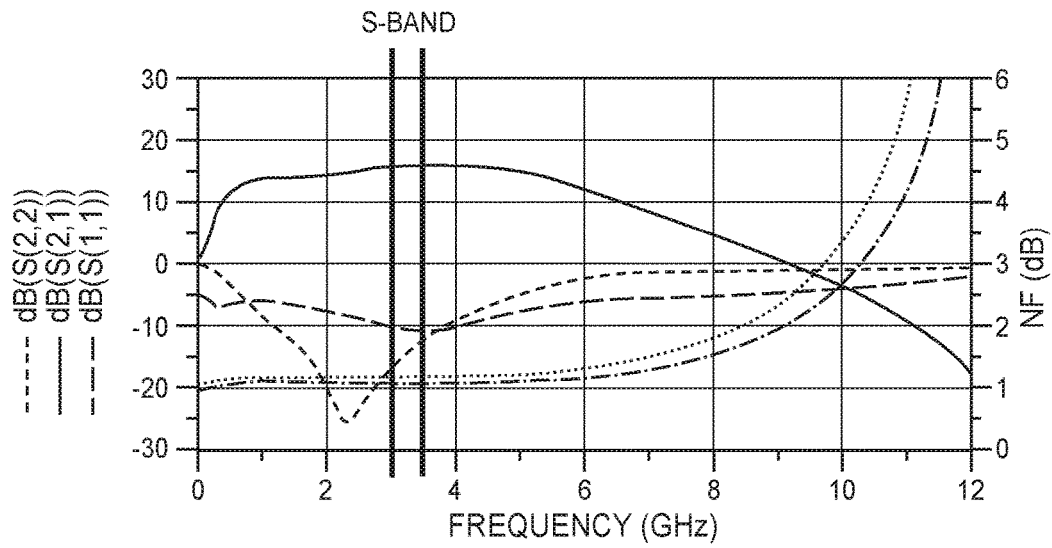
FIG. 12
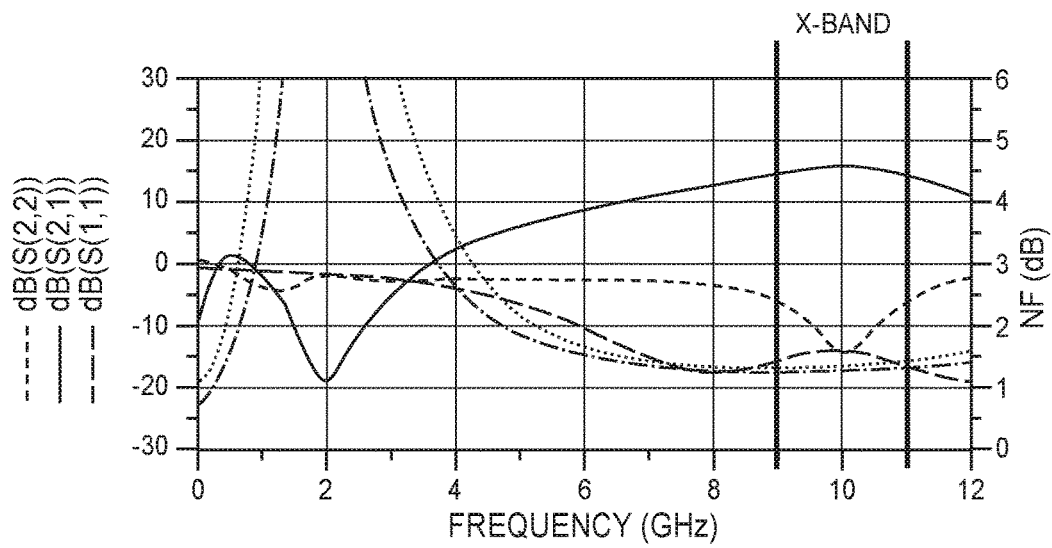
FIG. 13
| BAND | SW2 | SW3:SW4 | SW1 | SW5 | SW6 |
|---|---|---|---|---|---|
| S-BAND | ON | OFF | OFF | OFF | ON |
| X-BAND | OFF | ON | ON | ON | ON |
FIG. 14

RECONFIGURABLE LOW-NOISE AMPLIFIER (LNA)

RELATED APPLICATIONS

This application claims the benefit of provisional patent application Ser. No. 62/398,535, filed Sep. 23, 2016, the disclosure of which is hereby incorporated herein by reference in its entirety.

FIELD OF THE DISCLOSURE

The present disclosure pertains to amplifiers and in particular to low-noise amplifiers included in communications equipment to amplify received signals.

BACKGROUND

Gallium nitride high electron mobility transistor-based low-noise amplifiers (LNAs), like other semiconductors, have a complex source impedance or reflection coefficient referred to in industry as gamma, opt ($G_{OPT}$) that provides a minimum noise figure ($NF_{MIN}$). For a well-matched LNA, $G_{OPT}$ and an LNA's scattering parameter S11, known as the return loss parameter, are both close to 50Ω in the center of the Smith chart.

These types of LNAs also have a preferred gate periphery for a given frequency band. The preferred gate periphery is chosen based upon $G_{OPT}$. Thus, it has been traditionally desirable to reconfigure the gate periphery for each band of operation. However, traditional reconfiguration of the gate periphery requires additional radio frequency isolation switches on gates and drains of the LNA. Parasitic electrical characteristics associated with the additional radio frequency isolation switches prohibit exploiting inherent $NF_{MIN}$ properties of the LNA at high frequencies. Thus, there is a need for a reconfigurable LNA having a fixed gate periphery and an adjustable noise matching architecture that provides multi-octave frequency operation for next-generation advanced wideband radio systems.

SUMMARY

A reconfigurable low-noise amplifier (LNA) is disclosed. The reconfigurable LNA includes amplifier circuitry having a gate terminal coupled to an input terminal, a source terminal coupled to a fixed voltage node, and a drain terminal coupled to an output terminal. The reconfigurable LNA further includes a gamma inverting network (GIN) coupled between the input terminal and the fixed voltage node, wherein the GIN has a first switch configured to disable the GIN during operation at first frequencies within a lower frequency band relative to a higher frequency band and to enable the GIN during operation at second frequencies within the higher frequency band.

In an exemplary embodiment, the reconfigurable LNA further includes a parallel feedback network (PFN) coupled between the gate terminal and the drain terminal, wherein the PFN has a second switch configured to enable the PFN during operation at the first frequencies within the lower frequency band and to disable the PFN during operation at the second frequencies within the higher frequency band.

In yet another embodiment, the reconfigurable LNA further includes a series feedback network (SFN) coupled between the source terminal and the fixed voltage node, wherein the SFN has a third switch configured to enable the SFN during operation at the second frequencies within the higher frequency band and to disable the SFN during operation at the first frequencies within the lower frequency band.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 12 is a graph that depicts tuned S-parameter gain, return-loss, NF, and stability factor for S-band operation of the reconfigurable LNA embodiment of FIG. 11.

FIG. 13 is a graph that depicts tuned S-parameter gain, return-loss, NF, and stability factor for X-band operation of the reconfigurable LNA embodiment of FIG. 11.

FIG. 14 is a table that provides a switch state (ON/OFF) for each of the reconfigurable switch elements of the reconfigurable LNA for operation within the S-band and the X-band, respectively.

DETAILED DESCRIPTION

Figure 1:
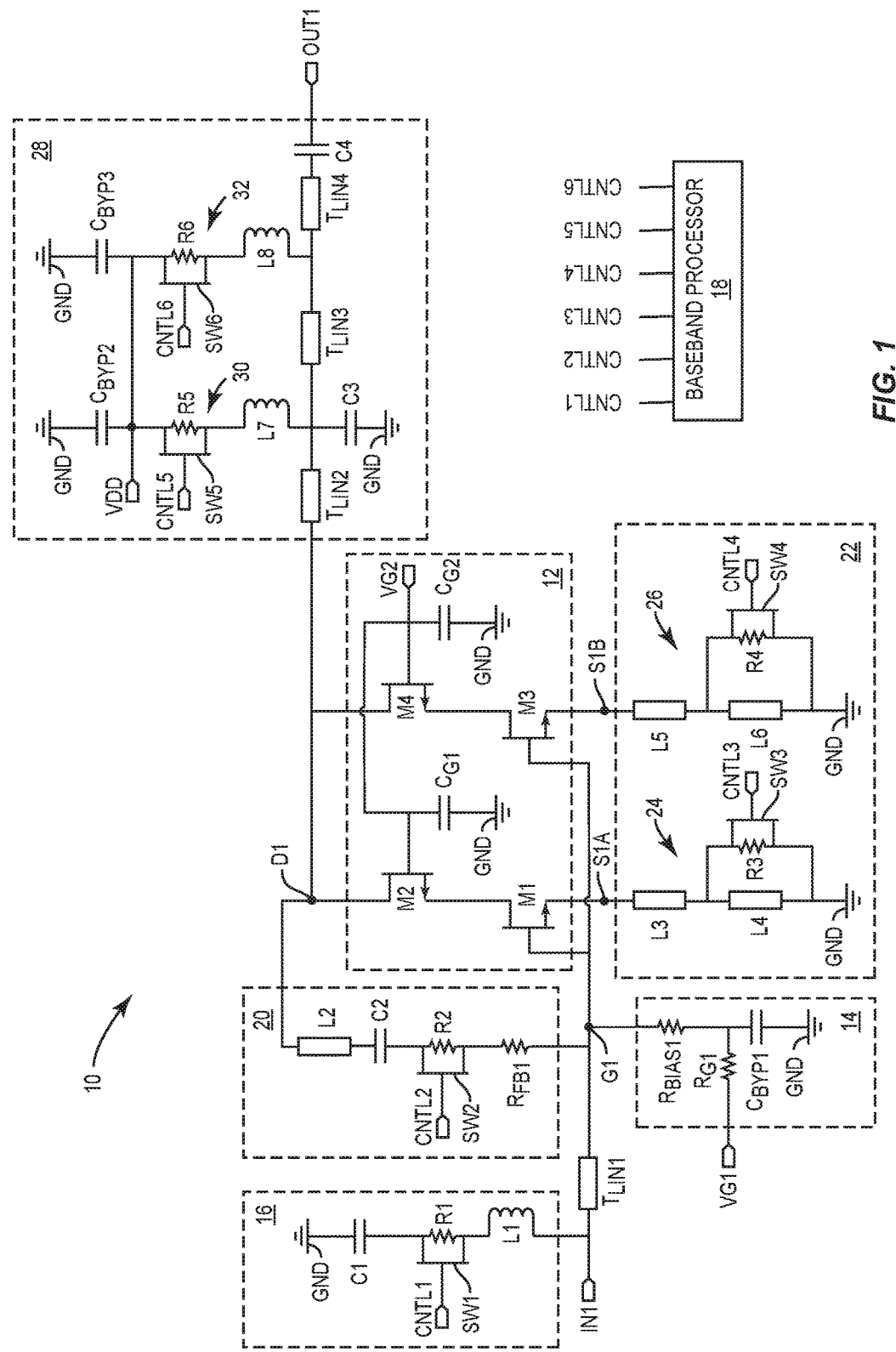
FIG. 1 is a circuit schematic of a first embodiment of a reconfigurable low-noise amplifier (LNA) that in accordance with the present disclosure maintains a specific complex input impedance or reflection coefficient referred to in industry as gamma, opt ($G_{OPT}$) that provides a minimum noise figure ($NF_{MIN}$).

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. The term "enable" when referring to enabling circuitry and networks is defined as having one or more switches within the circuitry or networks placed in an on-state that allows current to flow through the one or more switches. The term "disable" when referring to disabling circuitry and networks is defined as having one or more switches within the circuitry placed in an off-state that blocks current from flowing through the one or more switches.

FIG. 1 is a circuit schematic of a first embodiment of a reconfigurable low-noise amplifier (LNA) 10 that in accordance with the present disclosure maintains a specific complex input impedance or reflection coefficient referred to in industry as gamma, opt ($G_{OPT}$) that provides a minimum noise figure ($NF_{MIN}$). The reconfigurable LNA 10 includes amplifier circuitry 12 that has a gate terminal G1 coupled to an input terminal IN1, source terminals S1A and S1B coupled to a fixed voltage node GND, and a drain terminal D1 coupled to an output terminal OUT1. The fixed voltage node GND is typically ground, and in this exemplary embodiment the gate terminal G1 is coupled to the input terminal IN1 through a first transmission line $T_{LIN1}$.

The amplifier circuitry 12 includes field-effect transistor (FET) devices M1 and M2 coupled in a cascode configuration between the drain terminal D1 and the source terminal S1A. In this exemplary embodiment, the amplifier circuitry 12 further includes FET devices M3 and M4 coupled in a cascode configuration between the drain terminal D1 and the source terminal S1B. A first gate capacitor $C_{G1}$ is coupled between a gate of the FET device M2 and the fixed voltage node GND, and a second gate capacitor $C_{G2}$ is coupled between a gate of the FET device M3 and the fixed voltage node GND.

Gate bias circuitry 14 for supplying a bias voltage for the FET devices M1 and M3 is coupled between the gate terminal G1 and the fixed voltage node GND. The gate bias circuitry 14 includes a bias resistor $R_{BIAS1}$ and a first bypass capacitor $C_{BYP1}$ that are coupled in series between the gate terminal G1 and the fixed voltage node GND. A gate resistor $R_{G1}$ is coupled between a first gate bias terminal VG1 and a node between the bias resistor $R_{BIAS1}$ and the first bypass capacitor $C_{BYP1}$. Gate bias for the FET devices M2 and M4 is supplied through a second gate bias terminal VG2 from external bias circuitry (not shown).

A gamma inverting network (GIN) 16 is coupled between the input terminal IN1 and the fixed voltage node GND, wherein the GIN 16 has a first switch SW1 configured to disable the GIN 16 during operation at first frequencies within a lower frequency band and to enable the GIN 16 during operation at second frequencies within a higher frequency band, which is higher than the lower frequency band. In an exemplary embodiment, the GIN 16 comprises a first inductor L1 and a first capacitor C1 coupled in series through the first switch SW1 such that current flow is enabled through the first inductor L1 when the first switch SW1 is in an on-state and current flow is disabled through the first inductor L1 when the first switch SW1 is in an off-state. The on-state and the off-state of the first switch SW1 is controlled through a control terminal CTRL1 that is typically coupled to an output of a digital processor such as a baseband processor 18 of a wireless communication device (not shown). A first drain-to-source resistor R1 provides protection and equal source and drain potential for the first switch SW1 during on-state to off-state transitions that interrupt current flow through the first inductor L1.

During lower band operation, the first switch SW1 of the GIN 16 is in the off-state. When preparing for higher band operation, a scattering parameter S11 known as the return loss parameter together with $G_{OPT}$ are inverted relative to a previous state when the first switch SW1 is transitioned from the off-state to the on-state. The inversion of $G_{OPT}$ and scattering parameter S11 provides an easily noise-matched noise figure close to $NF_{MIN}$ when the reconfigurable LNA 10 is operated at the second frequencies within the higher frequency band.

The reconfigurable LNA 10 further includes a parallel feedback network (PFN) 20 coupled between the gate terminal G1 and the drain terminal D1. The PFN 20 has a second switch SW2 configured to enable the PFN 20 during operation at the first frequencies within the lower frequency band and to disable the PFN 20 during operation at the second frequencies within the higher frequency band. The $NF_{MIN}$ during lower band operation is enhanced when the second switch is in the on-state, thereby enabling the PFN 20. In an exemplary embodiment, a first feedback resistor $R_{FB1}$, a second inductor L2, and a second capacitor C2 are coupled in series with the second switch SW2 such that current flow is enabled through the second inductor L2 when the second switch SW2 is in an on-state and current flow is disabled when the second switch SW2 is in an off-state. The on-state and the off-state of the second switch SW2 is controlled through a second control terminal CTRL2 that in this exemplary embodiment is coupled to the baseband processor 18. A second drain-to-source resistor R2 provides protection and equal source and drain potential for the second switch SW2 during on-state to off-state transitions that interrupt current flow through the second inductor L2. It is to be understood that while the first resistor $R_{FB1}$ and the second capacitor C2 are schematically shown as discrete components, the first feedback resistor $R_{FB1}$, the second capacitor C2, and the second inductor L2 are realizable as a transmission line.

The exemplary embodiment of the reconfigurable LNA 10 further includes a series feedback network (SFN) 22 coupled between the source terminals S1A and S1B and the fixed voltage node GND, wherein the SFN 22 has a third switch SW3 configured to enable the SFN 22 when the third switch SW3 is in an on-state during operation at the second frequencies within the higher frequency band and to disable the SFN 22 when the third switch SW3 is in an off-state during operation at the first frequencies within the lower frequency band.

In the exemplary embodiment of FIG. 1, the SFN 22 has a first series feedback branch 24 that has a third inductor L3 and a fourth inductor L4 coupled in series between the source terminal S1A and the fixed voltage node GND. The third switch SW3 is coupled across the fourth inductor L4 such that the fourth inductor L4 is shorted by the third switch SW3 when the third switch SW3 is in the on-state. As such, current flowing through the third inductor L3 bypasses the fourth inductor L4 when the third switch SW3 is in the on-state. In contrast, when the third switch SW3 is in the off-state current flowing through the third inductor L3 also flows through the fourth inductor L4. The on-state and the off-state of the third switch SW3 is controlled through a third control terminal CTRL3 that in this exemplary embodiment is coupled to the baseband processor 18. A third drain-to-source resistor R3 provides protection and equal source and drain potential for the third switch SW3 during on-state to off-state transitions that interrupt current flow through the fourth inductor L4.

In this exemplary embodiment, the SFN 22 also has a second series feedback branch 26 that has a fifth inductor L5 and a sixth inductor L6 coupled in series between the source terminal S1B and the fixed voltage node GND. A fourth switch SW4 is coupled across the sixth inductor L6 such that the sixth inductor L6 is shorted by the fourth switch SW4 when the fourth switch SW4 is in the on-state. As such, current flowing through the fifth inductor L5 bypasses the sixth inductor L6 when the fourth switch SW4 is in the on-state. In contrast, when the fourth switch SW4 is in the off-state current flowing through the fifth inductor L5 also flows through the sixth inductor L6. The on-state and the off-state of the fourth switch SW4 is controlled through a fourth control terminal CTRL4 that in this exemplary embodiment is coupled to the baseband processor 18. A fourth drain-to-source resistor R4 provides protection and equal source and drain potential for the fourth switch SW4 during on-state to off-state transitions that interrupt current flow through the sixth inductor L6.

The exemplary embodiment of FIG. 1 further includes an output matching network (OMN) 28 coupled between the drain terminal D1 and the output terminal OUT1, wherein the OMN 28 is configured to match impedance of the amplifier circuitry 12 at the drain terminal D1 to load impedance at the output terminal OUT1.

In this particular embodiment, a first matching branch 30 is coupled between the drain D1 and the fixed voltage node GND through a second transmission line $T_{LIN2}$. The first matching branch 30 includes a fifth switch SW5 that selectively couples a seventh inductor L7 in series with a second bypass capacitor $C_{BYP2}$. Current flow is enabled through the seventh inductor L7 when the fifth switch SW5 is in an on-state, and current flow is disabled when the fifth switch SW5 is in an off-state. The on-state and the off-state of the fifth switch SW5 is controlled through a fifth control terminal CTRL5 that in this exemplary embodiment is coupled to the baseband processor 18. A fifth drain-to-source resistor R5 provides protection and equal source and drain potential for the fifth switch SW5 during on-state to off-state transitions that interrupt current flow through the seventh inductor L7. A third capacitor C3 coupled in parallel with the first matching branch provides additional filtering. In this particular embodiment, power is supplied to the amplifier circuitry 12 through the OMN 28 by way a supply terminal VDD.

Further included in the exemplary embodiment is a second matching branch 32 coupled between the drain D1 and the fixed voltage node GND through the second transmission line $T_{LIN2}$ and a third transmission line $T_{LIN3}$. The second matching branch 32 includes a sixth switch SW6 that selectively couples an eighth inductor L8 in series with a third bypass capacitor $C_{BYP3}$. Current flow is enabled through the eighth inductor L8 when the sixth switch SW6 is in an on-state, and current flow is disabled when the sixth switch SW6 is in an off-state. The on-state and the off-state of the sixth switch SW6 is controlled through a sixth control terminal CTRL6 that in this exemplary embodiment is coupled to the baseband processor 18. A sixth drain-to-source resistor R6 provides protection for the sixth switch SW6 during on-state to off-state transitions that interrupt current flow through the eighth inductor L8. In the exemplary embodiment shown in FIG. 1, the output terminal OUT1 is coupled to the drain terminal D1 through a coupling capacitor C4 and the second, third, and fourth transmission lines $T_{LIN2}$, $T_{LIN3}$, and $T_{LIN4}$. The first matching branch 30 and the second matching branch 32 are independently switched so that the OMN 28 is usable to match output return losses for two different frequency bands. While the first switch SW1, the second switch SW2, the third switch SW3, the fourth switch SW4, and the fifth switch SW5 are depicted as transistors, it is to be understood that the these switches can also be microelectromechanical systems switches.

Figure 2:
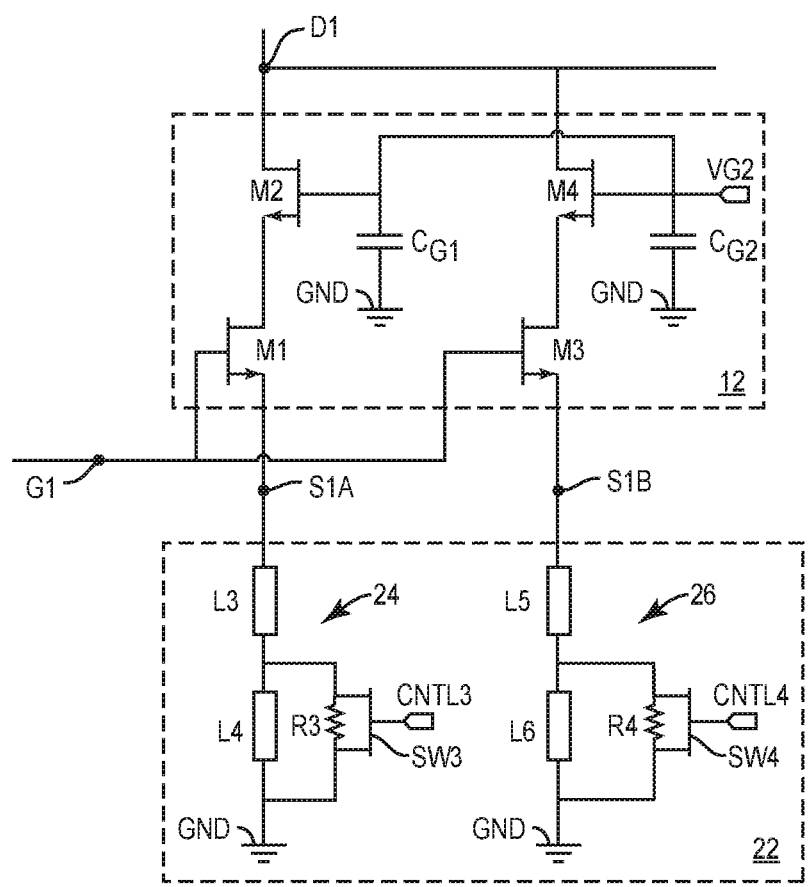
FIG. 2 is a circuit schematic of active circuitry during a first mode of operation that includes amplifier circuitry and a series feedback network.

FIG. 2 is a circuit schematic of active circuitry during a first mode of operation that includes the amplifier circuitry 12 and the SFN 22. In this exemplary embodiment, the amplifier circuitry 12 employs gallium nitride (GaN)-based FET devices (M1, M2, M3, and M4) that each have a 0.15 μm gate periphery. In the first mode of operation, the third switch SW3 and the fourth switch SW4 are both in their off-state so that the fourth inductor L4 and the sixth inductor L6 contribute additional inductance to provide additional source feedback for lower frequency band operation.

In a second mode of operation, the third switch SW3 and the fourth switch SW4 are both in their on-state so that the fourth inductor L4 and the sixth inductor L6 are shorted and do not contribute additional inductance. As a result, the SFN 22 allows the amplifier circuitry 12 to behave like a relatively simple cascode amplifier.

Figure 3:
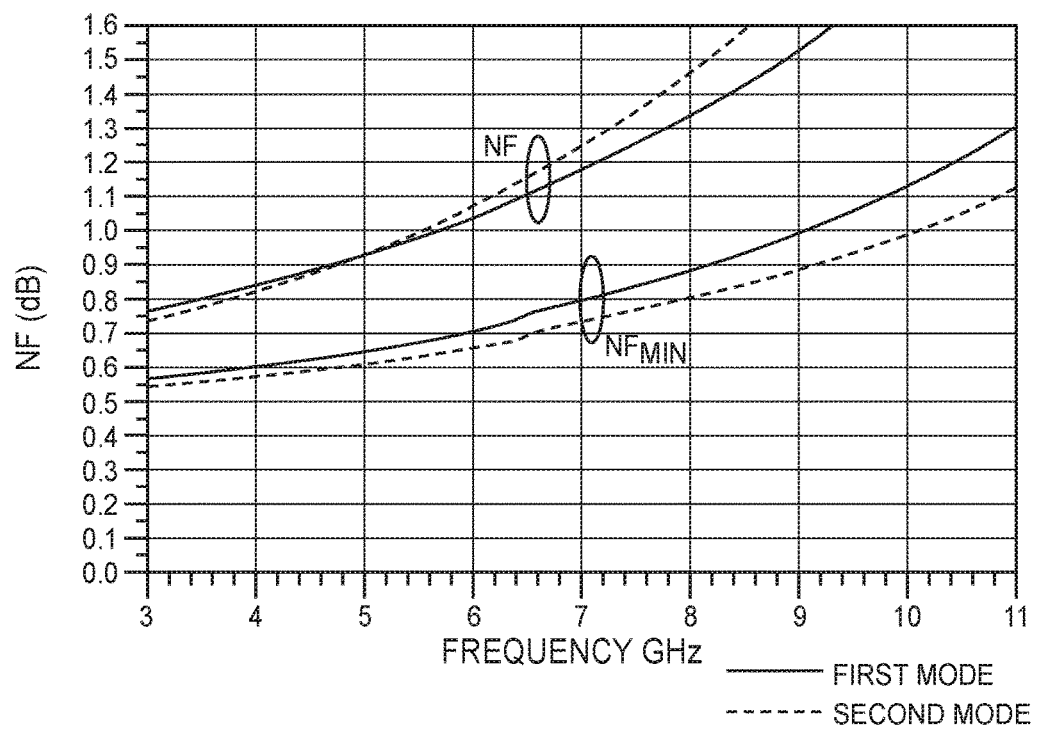
FIG. 3 is a graph of noise figure (NF) versus frequency for active circuitry of FIG. 2 comparing the first mode of operation with additional series source inductance and without the additional series source inductance in a second mode of operation.
Figure 4:
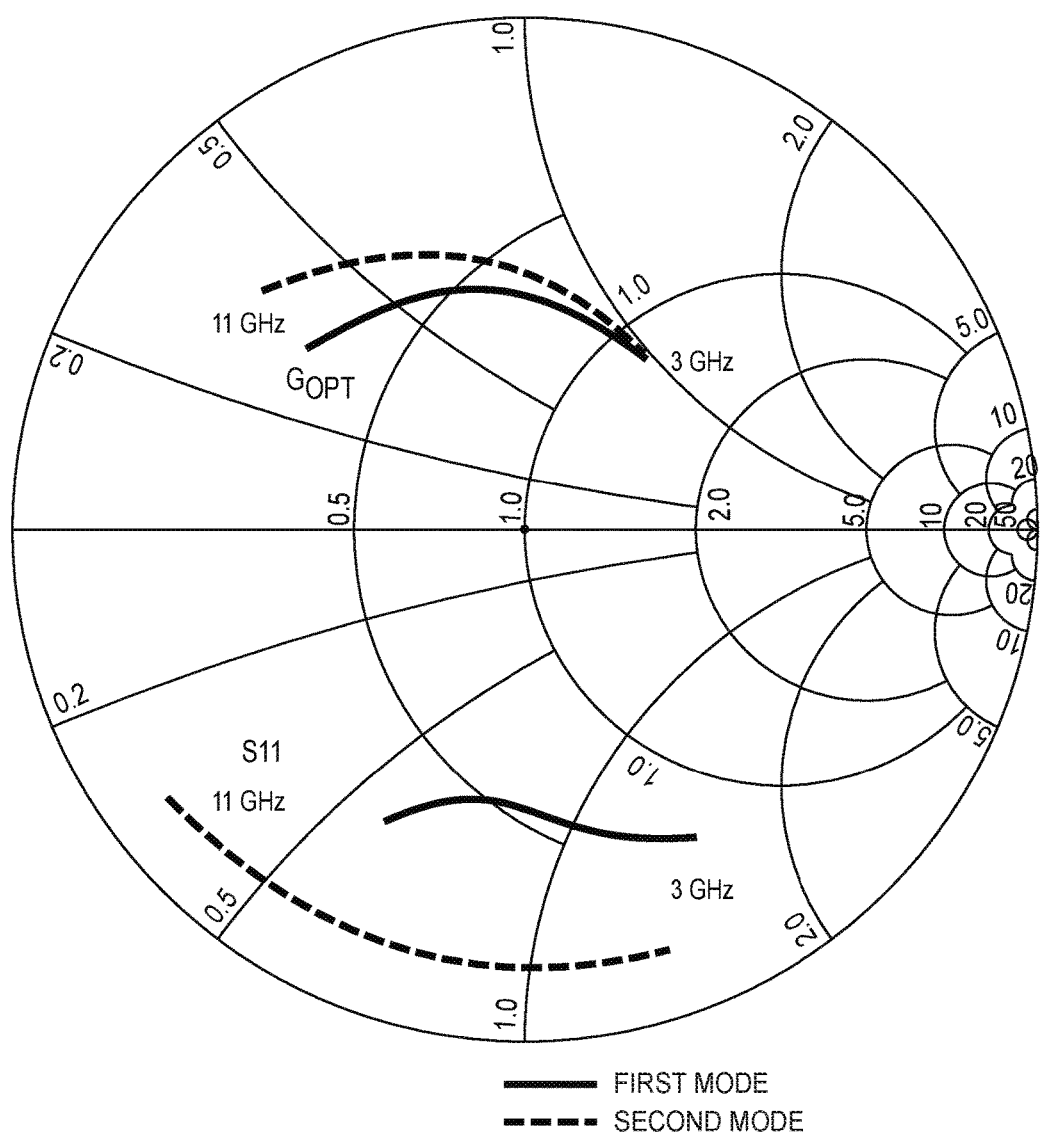
FIG. 4 is a Smith chart that compares responses for $G_{OPT}$ and the scattering parameter S11 from 3 GHz to 11 GHz for the reconfigurable LNA operated in the first mode with the relatively simple cascode amplifier performance of the second mode of operation.

FIG. 3 is a graph of noise figure (NF) versus frequency for active circuitry of FIG. 2 comparing the first mode of operation with additional series source inductance without the additional series source inductance in the second mode of operation in which the amplifier circuitry 12 operates as a relatively simple cascode amplifier. FIG. 4 is a Smith chart that compares responses for $G_{OPT}$ and the scattering parameter S11 from 3 GHz to 11 GHz for the reconfigurable LNA 10 operated in the first mode with the relatively simple cascode amplifier performance of the second mode of operation. In this case, the first mode of operation provides an improved low frequency (3 GHz) scattering parameter S11 that is closer to 50Ω than the second mode of operation and is also closer to a conjugate of $G_{OPT}$ at low frequency (3 GHz) and even at high frequencies (11 GHz).

Figure 5:
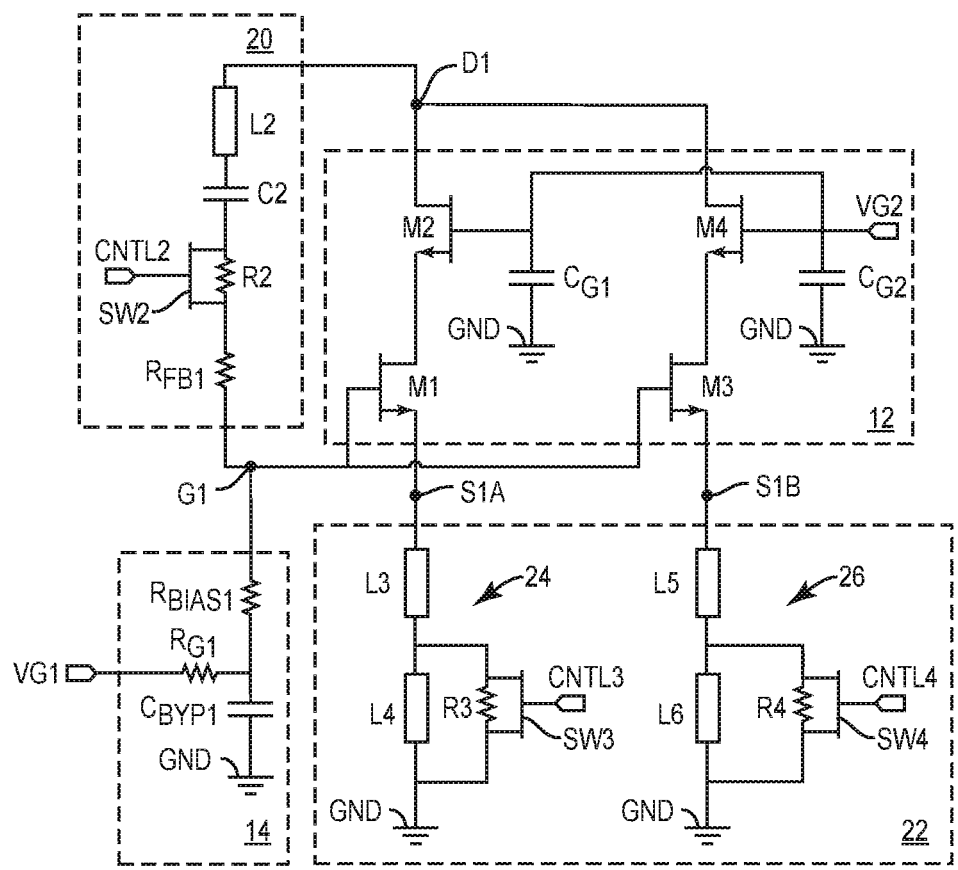
FIG. 5 is a circuit schematic of active circuitry during a third mode of operation that enables the amplifier circuitry, the series feedback network, and a parallel feedback network.

FIG. 5 is a circuit schematic of active circuitry during a third mode of operation that enables the amplifier circuitry 12, the SFN 22 is disabled, and the PFN 20 is enabled, allowing optimum low-frequency noise operation.

Figure 6:
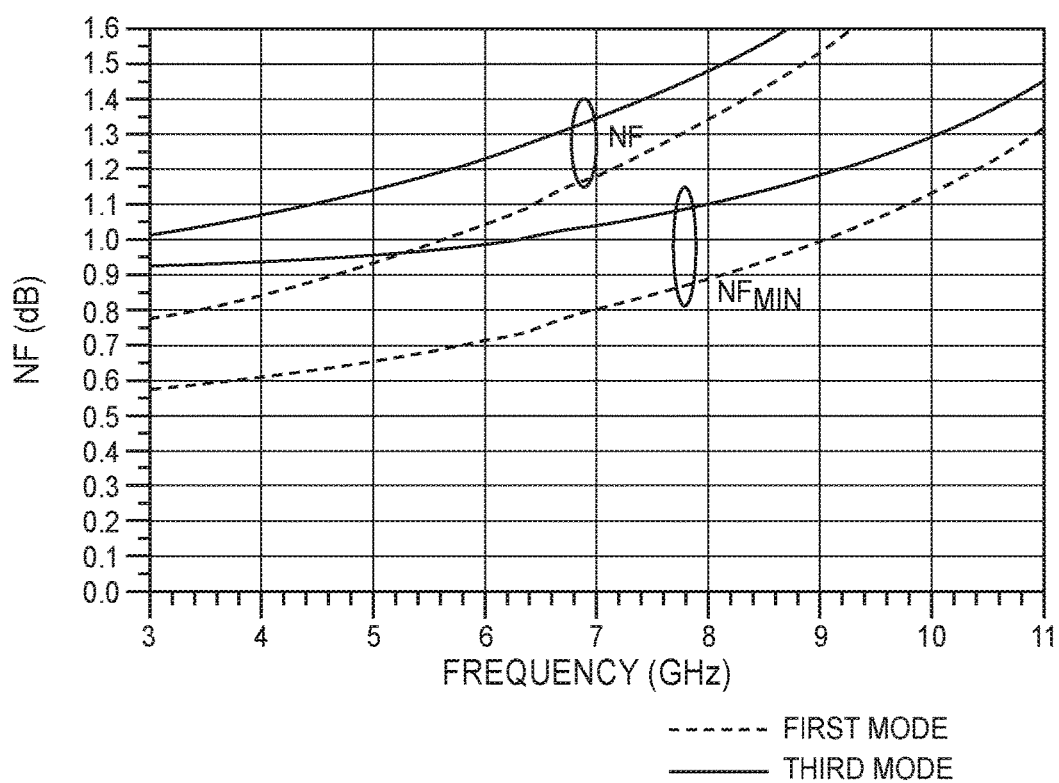
FIG. 6 is a graph of NF versus frequency for active circuitry of FIG. 5 comparing the first mode of operation with the third mode of operation that in addition to the first mode of operation activates the parallel feedback network.

FIG. 6 is a graph of NF versus frequency for active circuitry of FIG. 5 comparing the first mode of operation with the third mode of operation that in addition to the first mode of operation activates the PFN 20. In particular, FIG. 6 illustrates that the third mode of operation achieves relatively higher lower frequency NF and $NF_{MIN}$ compared with the first mode of operation that does not include activation of the PFN 20. However, the difference between the lower frequency NF and $NF_{MIN}$ is closer together, indicating an improved scattering parameter S11 and $G_{OPT}$ match at lower frequencies that in this exemplary case are of the S-band.

Figure 7:
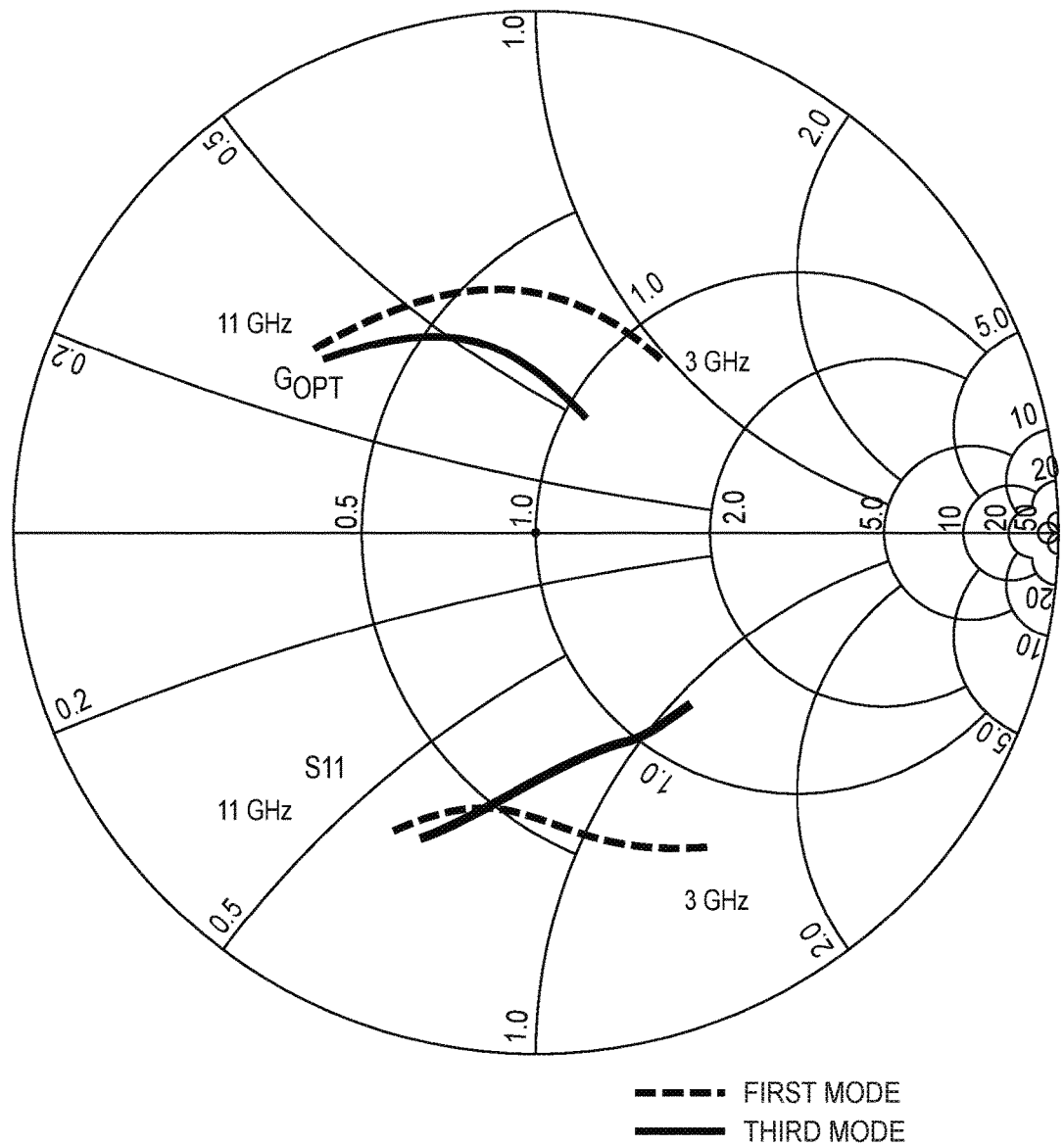
FIG. 7 is a Smith chart that compares the first mode operation of the reconfigurable LNA with the reconfigurable LNA operated in the third mode with regard to resulting responses for $G_{OPT}$ and the scattering parameter S11 from 3 GHz to 11 GHz.

In this regard, FIG. 7 is a Smith chart that compares the first mode of operation of the reconfigurable LNA 10 with the reconfigurable LNA 10 operated in the third mode with regard to resulting responses for $G_{OPT}$ and the scattering parameter S11 from 3 GHz to 11 GHz. At 3 GHz, both scattering parameter S11 and $G_{OPT}$ are closer to 50Ω during third mode of operation in comparison to first mode of operation. This illustrates that the PFN 20 improves practical scattering parameter S11 and 50Ω NF match.

Figure 8:
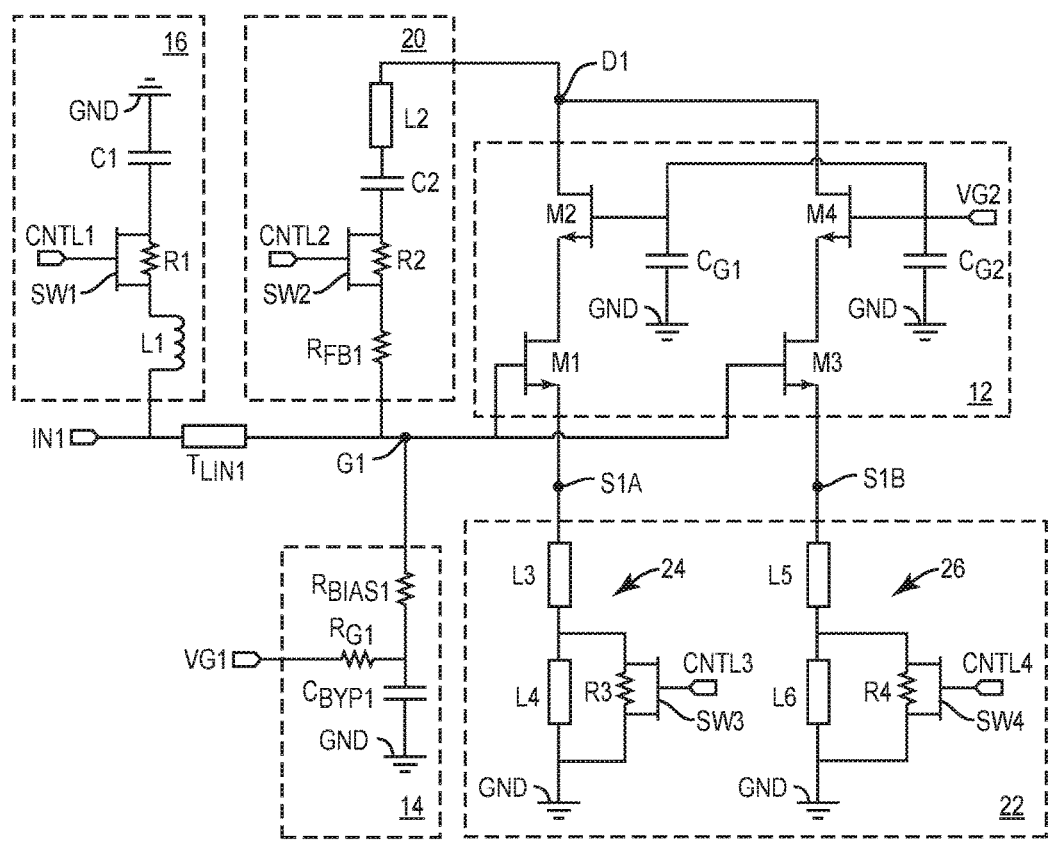
FIG. 8 is a circuit schematic of active circuitry during a fourth mode of operation that enables the amplifier circuitry, the series feedback network, the parallel feedback network, and a gamma inverting network.

FIG. 8 is a circuit schematic of active circuitry during a fourth mode of operation that enables the amplifier circuitry 12, with the SFN 22 with first series feedback branch 24 enabled and the second series feedback branch 26 also enabled (i.e., the fourth switch SW4 in the on-state), the PFN 20 disabled, and the GIN 16 enabled.

Figure 9:
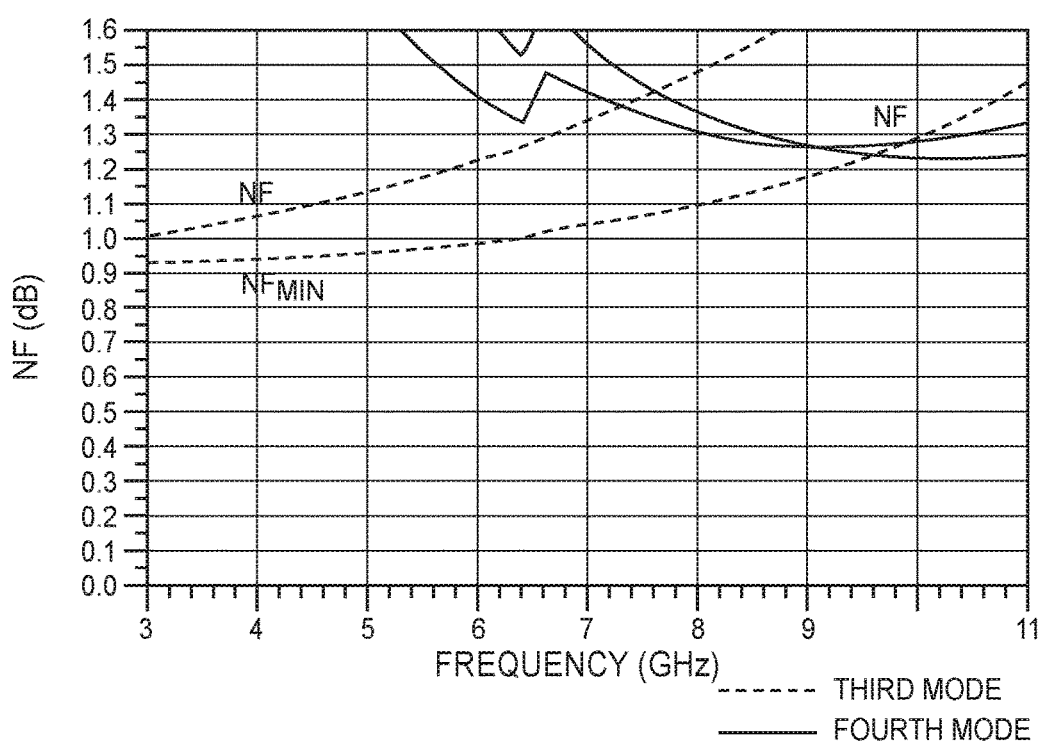
FIG. 9 is a graph of NF versus frequency for the active circuitry of FIG. 8 comparing the third mode of operation with the fourth mode of operation that activates the gamma inverting network.

FIG. 9 is a graph of NF versus frequency for the active circuitry of FIG. 8 comparing the third mode of operation with the fourth mode of operation that activates the GIN 16. Note that the NF and $NF_{MIN}$ become closer at the higher frequency of 11 GHz due to improved high frequency $G_{OPT}$ and scattering parameter S11 match in this configuration.

Figure 10:
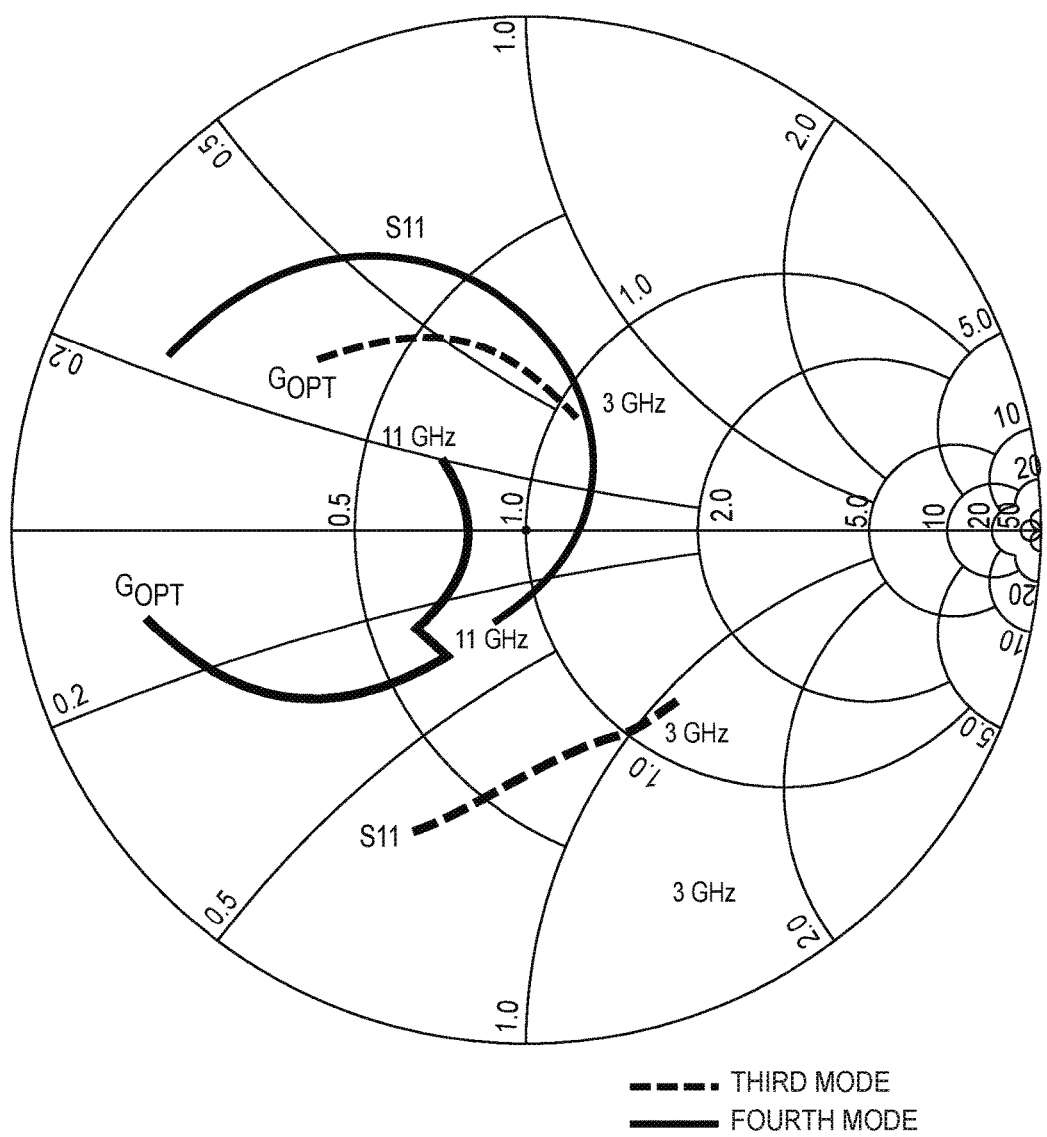
FIG. 10 is a Smith chart that compares the third mode of operation of the reconfigurable LNA of the present disclosure with the fourth mode of operation of the reconfigurable LNA with regard to $G_{OPT}$ and the scattering parameter S11 from 3 GHz to 11 GHz.

FIG. 10 is a Smith chart that compares the third mode of operation of the reconfigurable LNA 10 with the fourth mode of operation of the reconfigurable LNA 10 with regard to $G_{OPT}$ and the scattering parameter S11 from 3 GHz to 11 GHz. In particular, FIG. 10 illustrates that the fourth mode of operation provides a $G_{OPT}$ and scattering parameter S11 that are closer to 50Ω and more conjugate to each other with regard to impedance compared with the third mode of operation. GOPT is now in the lower half of the Smith chart, whereas scattering parameter S11 is in the upper half due to the activation of the GIN 16 in the fourth mode of operation. As a result of the activation of the GIN 16, an improved NF and scattering parameter S11 match at 50Ω is realized at higher frequencies, whereas deactivation of the GIN 16 and employing the third mode of operation improves NF and scattering parameter S11 match at 50Ω at lower frequencies.

Figure 11:
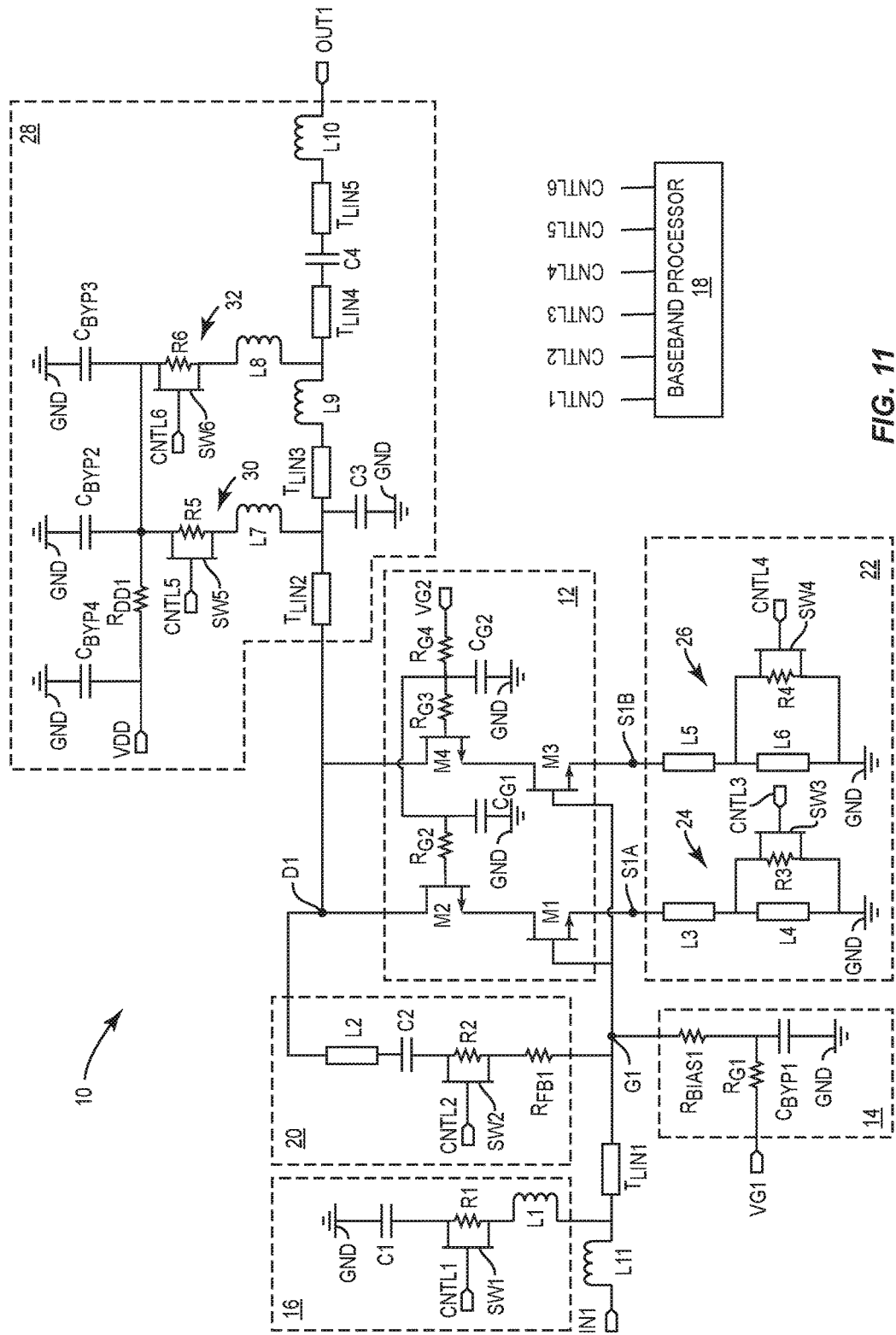
FIG. 11 is a circuit diagram of another embodiment of the reconfigurable LNA that includes additional circuitry configured to improve impedance matching.

FIG. 11 is a circuit diagram of another embodiment of the reconfigurable LNA 10 that includes addition circuitry configured to improve impedance matching. In this exemplary embodiment, the OMN 28 further includes a fourth bypass capacitor $C_{BYP4}$ coupled between the supply terminal VDD and the fixed voltage node GND and a supply filter resistor $R_{DD1}$ coupled between the first matching branch 30 and the supply terminal VDD. A ninth inductor L9 is coupled in series between the third transmission line $T_{LIN3}$ and the fourth transmission line $T_{LIN4}$. A fifth transmission line $T_{LIN5}$ is coupled in series with a tenth inductor L10 between the fourth capacitor C4 and the output terminal OUT1. An eleventh inductor L11 is coupled in series between the input terminal IN1 and the first transmission line $T_{LIN1}$ to provide additional filtering to radio frequency signals arriving at the input terminal IN1.

The exemplary embodiment of FIG. 11 is implemented with GaN high electron mobility transistor technology. The switches SW1-SW6 are realized with GaN FET technology. The FET devices M1-M4 of the amplifier circuitry 12 are realized using 0.15 μm gate periphery technology with each of FET devices M1-M4 having a transition frequency (fT) in excess of 40 GHz. A second gate resistor $R_{G2}$ is coupled in series with a gate of the FET device M2, a third gate resistor $R_{G3}$ is coupled in series with a gate of the FET device M4, and a fourth gate resistor $R_{G4}$ is coupled in series with the third gate resistor $R_{G3}$ and the second gate bias terminal VG2.

FIG. 12 is a graph that depicts tuned S-parameter gain, return-loss, NF, and stability factor for S-band operation of the reconfigurable LNA 10 of FIG. 11. FIG. 13 is a graph that depicts tuned S-parameter gain, return-loss, NF, and stability factor for X-band operation of the reconfigurable LNA 10 of FIG. 11. FIG. 14 is a table that provides a switch state (ON/OFF) for each of the reconfigurable switch elements of the reconfigurable LNA 10 for operation within the S-band and the X-band, respectively.

Figure 15:
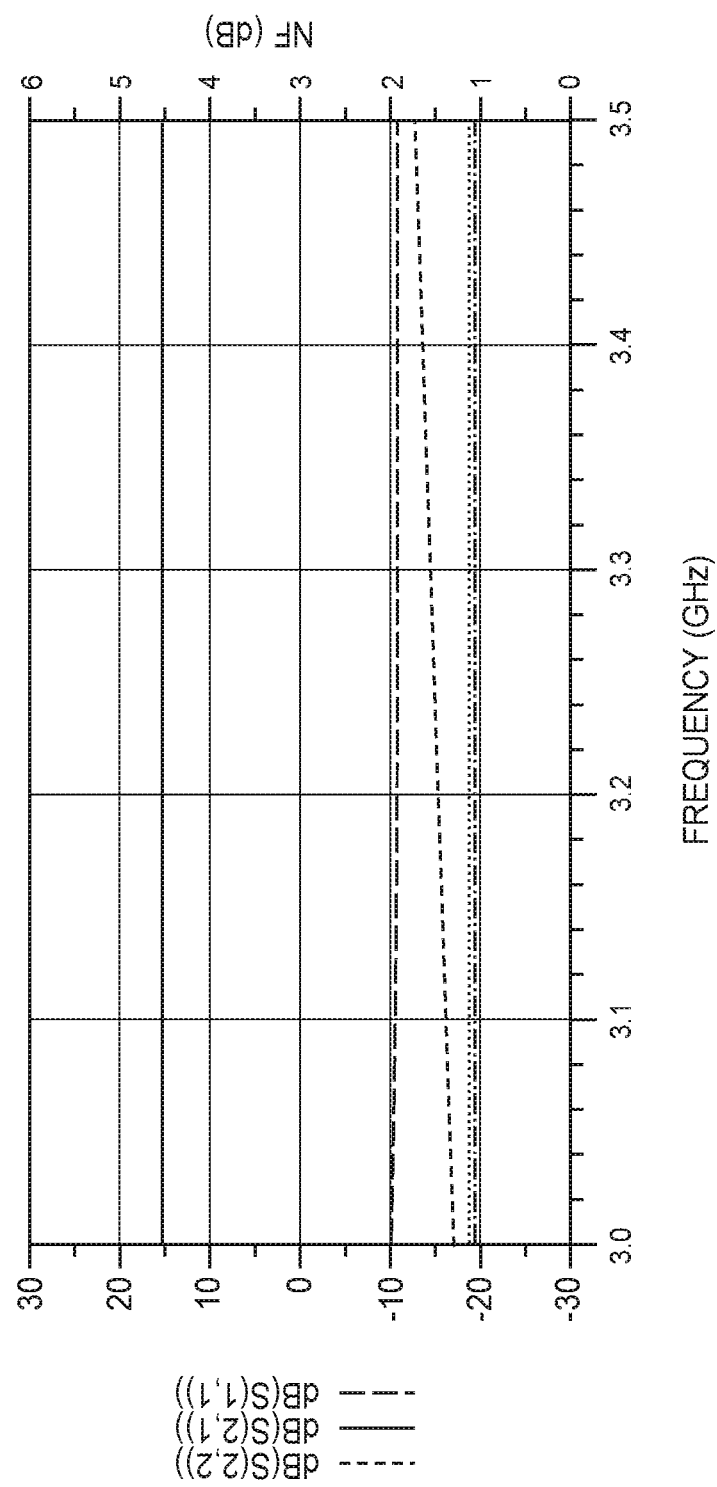
FIG. 15 is a graph depicting a 3-3.5 GHz low band switched tune response of an embodiment of the present disclosure.

FIG. 15 is a graph depicting a 3-3.5 GHz low band switched tune response of an embodiment of the present disclosure. In particular, FIG. 15 depicts S parameter, NF, and stability factor responses for the 3-3.5 GHz low band. As shown, the 3-3.5 GHz low band response achieves 15.2-15.5 dB of gain, a NF of 1.14-1.15 dB, input return loss of 10 dB, and an output return loss greater than 12 dB.

Figure 16:
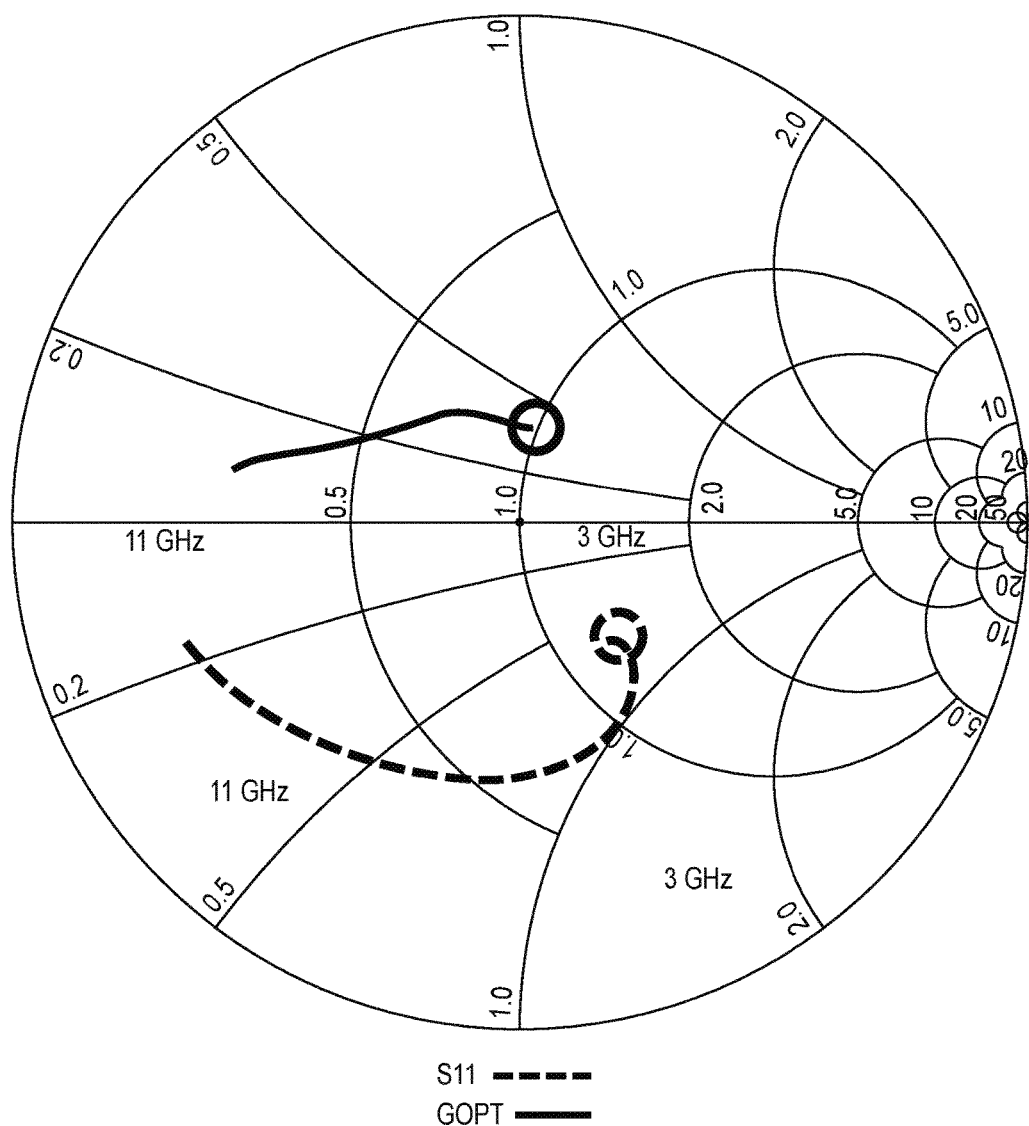
FIG. 16 is a Smith chart that illustrates resulting responses for $G_{OPT}$ and the scattering parameter S11 from 3 GHz to 11 GHz with the reconfigurable LNA configured for the 3-3.5 GHz low band switched tune response.

FIG. 16 is a Smith chart that illustrates resulting responses for $G_{OPT}$ and the scattering parameter S11 from 3 GHz to 11 GHz with the reconfigurable LNA 10 configured for the 3-3.5 GHz low band switched tune response. In particular, FIG. 16 depicts a resulting $G_{OPT}$ and scattering parameter S11 are practically matched to 50Ω and are practically conjugate and coincident to each other on the real axis of the Smith chart when the reconfigurable LNA 10 is operating at 3 GHz.

Figure 17:
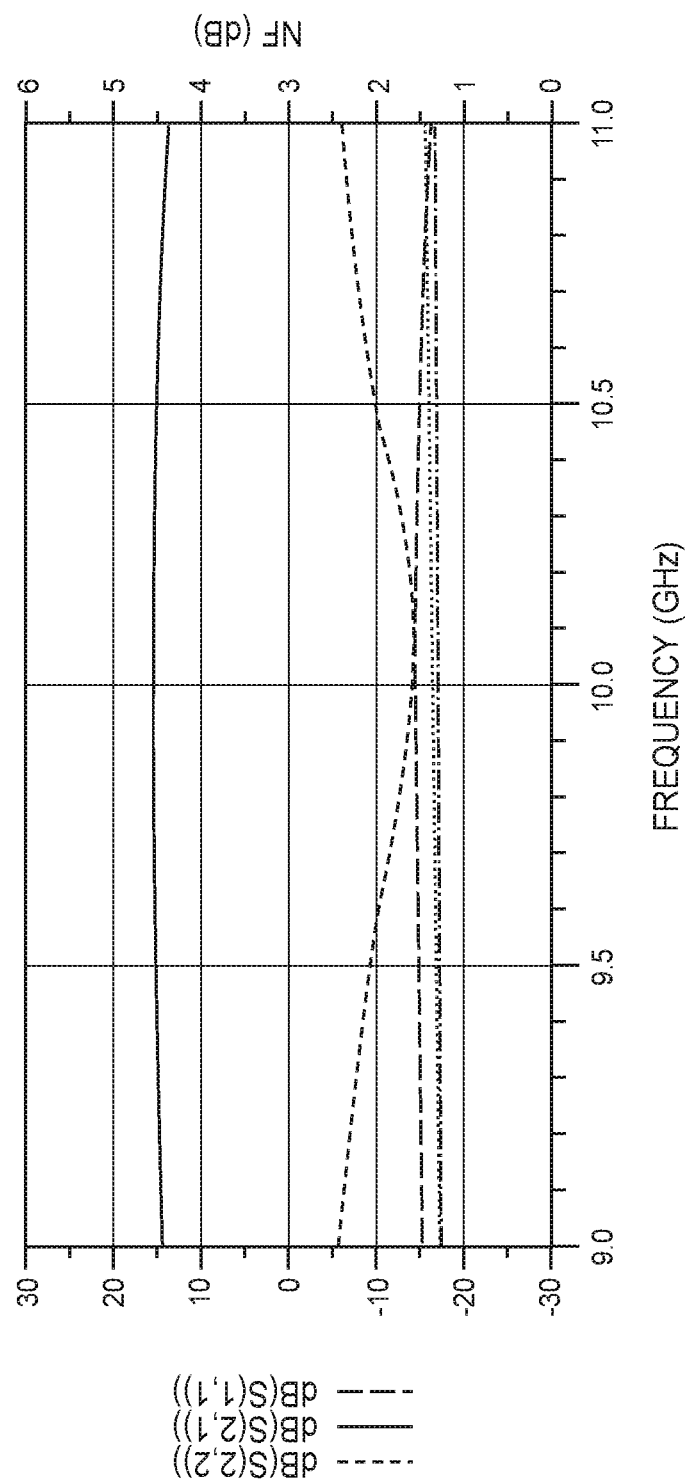
FIG. 17 is a graph depicting 9-11 GHz high band switched tune response of an embodiment of the present disclosure.

FIG. 17 is a graph depicting a 9-11 GHz high band switched tune response of an embodiment of the present disclosure. In particular, FIG. 17 depicts S parameter, NF, and stability factor responses for the 9-11 GHz high band. As shown, the 9-11 GHz high band response achieves 14.2-14.4 dB of gain, an NF of 1.27-1.41 dB, input return loss greater than 15 dB, and an output return loss greater than 12 dB.

Figure 18:
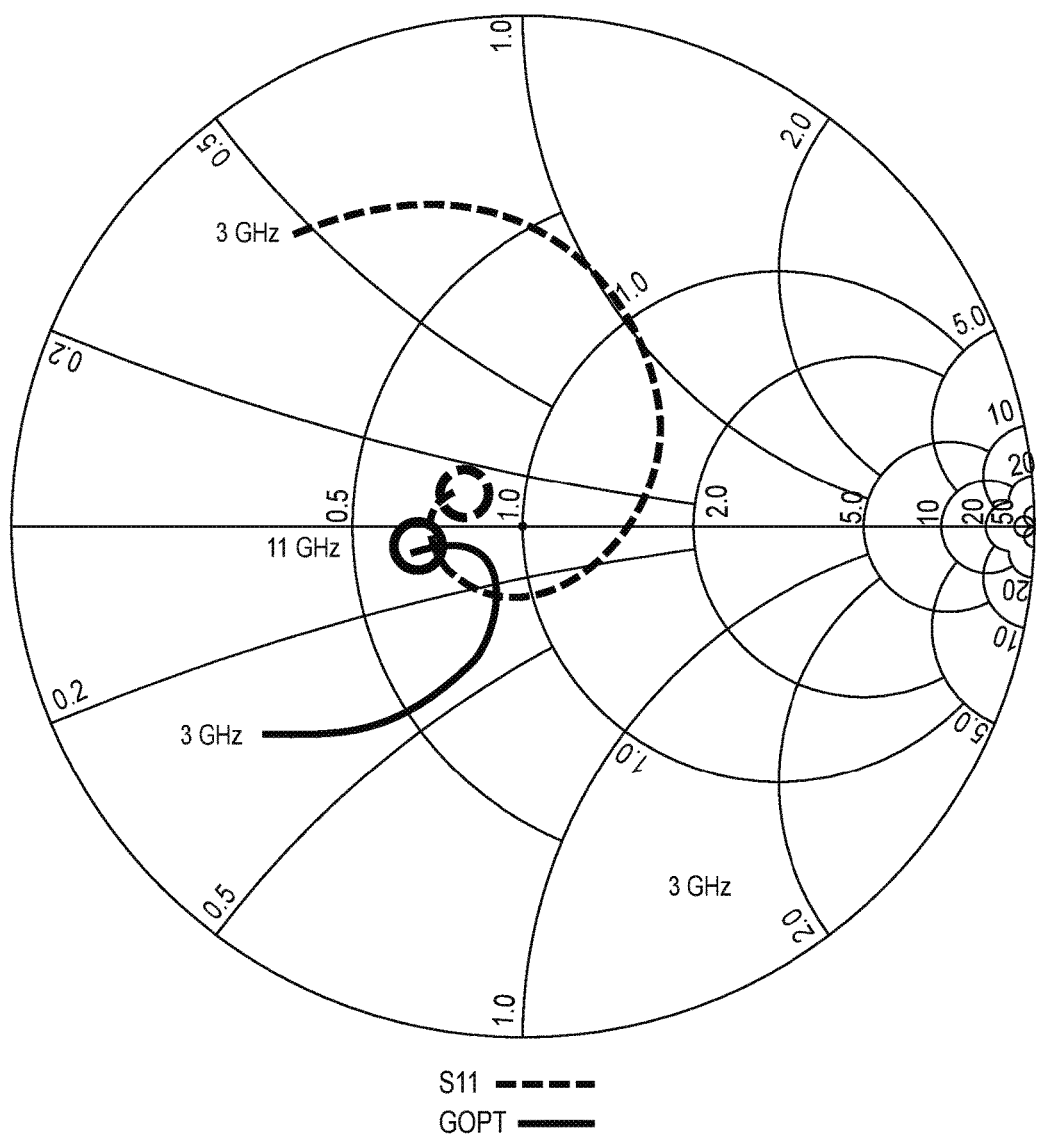
FIG. 18 is a Smith chart that illustrates resulting responses for $G_{OPT}$ and the scattering parameter S11.

FIG. 18 is a Smith chart that illustrates resulting responses for $G_{OPT}$ and the scattering parameter S11 from 3 GHz to 11 GHz with the reconfigurable LNA 10 configured for the 9-11 GHz high band switched tune response. In particular, FIG. 18 depicts a resulting $G_{OPT}$ and scattering parameter S11 that are practically matched to 50Ω and are practically conjugate and coincident to each other on the real axis of the Smith chart when the reconfigurable LNA 10 is operating at 11 GHz. In all, the Smith chart results of FIG. 18 illustrate the effectiveness of the input shunt inductive match configuration of the reconfigurable LNA 10 at high frequency. A series gate and source inductances are included in at least some embodiments to narrow-band resonate inherent gate-source capacitance $C_{GS}$ in order to match an inherent noise generator of one or more FET devices making up the reconfigurable LNA 10.

Those skilled in the art will recognize improvements and modifications to the preferred embodiments of the present disclosure. All such improvements and modifications are considered within the scope of the concepts disclosed herein and the claims that follow.

What is claimed is:

1. A reconfigurable low-noise amplifier (LNA) comprising:
    amplifier circuitry having a gate terminal coupled to an input terminal, a source terminal coupled to a fixed voltage node, and a drain terminal, wherein the amplifier circuitry comprises field-effect transistor (FET) devices coupled in a cascode configuration between the drain terminal and the source terminal; and
    a gamma inverting network (GIN) coupled between the input terminal and the fixed voltage node, wherein the GIN comprises:
    a first switch configured to disable the GIN during operation at first frequencies within a lower frequency band and to enable the GIN during operation at second frequencies within a higher frequency band, which is higher than the lower frequency band; and
    a first inductor and a first capacitor coupled in series through the first switch such that current flow is enabled through the first inductor when the first switch is in an on-state and current flow is disabled through the first inductor when the first switch is in an off-state.

2. The reconfigurable LNA of claim 1 further comprising a parallel feedback network (PFN) coupled between the gate terminal and the drain terminal, wherein the PFN has a second switch configured to enable the PFN during operation at the first frequencies within the lower frequency band and to disable the PFN during operation at the second frequencies within the higher frequency band.

3. The reconfigurable LNA of claim 2 wherein the PFN comprises a first resistor, a second inductor, and a second capacitor coupled in series with the second switch such that current flow is enabled through the second inductor when the second switch is in an on-state and current flow is disabled when the second switch is in an off-state.

4. The reconfigurable LNA of claim 1 further comprising a series feedback network (SFN) coupled between the source terminal and the fixed voltage node, wherein the SFN has a third switch configured to enable the SFN during operation at the second frequencies within the higher frequency band and to disable the SFN during operation at the first frequencies within the lower frequency band.

5. The reconfigurable LNA of claim 4 wherein the SFN comprises a third inductor coupled in parallel with the third switch such that current flow through the third inductor is prevented when the third switch is in an on-state and current flow is allowed when the third switch is in an off-state.

6. The reconfigurable LNA of claim 1 further comprising:
    a parallel feedback network (PFN) coupled between the gate terminal and the drain terminal, wherein the PFN has a second switch configured to enable the PFN during operation at the first frequencies within the lower frequency band and to disable the PFN during operation at the second frequencies within the higher frequency band; and
    a series feedback network (SFN) coupled between the source terminal and the fixed voltage node, wherein the SFN has a third switch configured to enable the SFN during operation at the second frequencies within the higher frequency band and to disable the SFN during operation at the first frequencies within the lower frequency band.

7. The reconfigurable LNA of claim 6 wherein the PFN comprises a first resistor, a second inductor, and a second capacitor coupled in series with the second switch such that current flow is enabled through the first resistor and second inductor when the second switch is in an on-state and current flow is disabled when the second switch is in an off-state.

8. The reconfigurable LNA of claim 6 wherein the SFN comprises a third inductor coupled in parallel with the third switch such that current flow through the third inductor is prevented when the third switch is in an on-state and current flow is allowed when the third switch is in an off-state.

9. The reconfigurable LNA of claim 1 wherein the FET devices are gallium nitride-based transistors.

10. The reconfigurable LNA of claim 1 further comprising an output matching network (OMN) coupled between the drain terminal and the output terminal, wherein the OMN is configured to match impedance of the amplifier circuitry at the drain terminal to load impedance at the output terminal.

11. The reconfigurable LNA of claim 10 wherein the OMN comprises:
   a fourth inductor coupled between the output terminal and the fixed voltage node; and
   a fourth switch coupled in series with the fourth inductor, wherein the fourth switch is configured to have an on-state to enable current flow through the fourth inductor during operation at the second frequencies within the higher frequency band and have an off-state to disable current flow through the fourth inductor during operation at the first frequencies within the lower frequency band.

12. The reconfigurable LNA of claim 1 wherein the lower frequency band extends from 2 GHz to 4 GHz and the higher frequency band extends from 8 GHz to 12 GHz.

13. A reconfigurable low-noise amplifier (LNA) comprising:
   amplifier circuitry having a gate terminal coupled to an input terminal, a source terminal coupled to a fixed voltage node, and a drain terminal coupled to an output terminal;
   a gamma inverting network (GIN) coupled between the input terminal and the fixed voltage node, wherein the GIN has a first switch configured to disable the GIN during operation at first frequencies within a lower frequency band and to enable the GIN during operation at second frequencies within a higher frequency band, which is higher than the lower frequency band;
   a parallel feedback network (PFN) coupled between the gate terminal and the drain terminal, wherein the PFN has a second switch configured to enable the PFN during operation at the first frequencies within the lower frequency band and to disable the PFN during operation at the second frequencies within the higher frequency band; and
   a series feedback network (SFN) coupled between the source terminal and the fixed voltage node, wherein the SFN has a third switch configured to enable the SFN during operation at the second frequencies within the higher frequency band and to disable the SFN during operation at the first frequencies within the lower frequency band.

14. The reconfigurable LNA of claim 13 wherein the GIN comprises a first inductor and a first capacitor coupled in series through the first switch such that current flow is enabled through the first inductor when the first switch is in an on-state and current flow is disabled through the first inductor when the first switch is in an off-state.

15. The reconfigurable LNA of claim 13 wherein the PFN comprises a first resistor, a second inductor, and a second capacitor coupled in series with the second switch such that current flow is enabled through the first resistor and second inductor when the second switch is in an on-state and current flow is disabled when the second switch is in an off-state.

16. The reconfigurable LNA of claim 13 wherein the SFN comprises a third inductor coupled in parallel with the third switch such that current flow through the third inductor is prevented when the third switch is in an on-state and current flow is allowed when the third switch is in an off-state.

17. The reconfigurable LNA of claim 13 wherein the amplifier circuitry comprises field-effect transistor (FET) devices coupled in a cascode configuration between the drain terminal and the source terminal.

18. The reconfigurable LNA of claim 17 wherein the FET devices are gallium nitride-based transistors.

19. The reconfigurable LNA of claim 13 wherein the lower frequency band extends from 2 GHz to 4 GHz and the higher frequency band extends from 8 GHz to 12 GHz.

20. The reconfigurable LNA of claim 13 further including a processor configured to selectively enable and disable the first switch, the second switch, and the third switch.

* * * * *